US008873271B2

(12) United States Patent
Lam et al.

(10) Patent No.: US 8,873,271 B2
(45) Date of Patent: Oct. 28, 2014

(54) 3D ARCHITECTURE FOR BIPOLAR MEMORY USING BIPOLAR ACCESS DEVICE

(75) Inventors: Chung H. Lam, Peekskill, NY (US); Jing Li, Ossing, NY (US); Kailash Gopalakrishnan, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 170 days.

(21) Appl. No.: 13/209,405

(22) Filed: Aug. 14, 2011

(65) Prior Publication Data

US 2013/0039110 A1 Feb. 14, 2013

(51) Int. Cl.
| | | |
|---|---|---|
| G11C 11/00 | (2006.01) | |
| H01L 27/24 | (2006.01) | |
| H01L 45/00 | (2006.01) | |
| H01L 27/22 | (2006.01) | |
| G11C 13/00 | (2006.01) | |
| G11C 7/00 | (2006.01) | |
| G11C 5/02 | (2006.01) | |

(52) U.S. Cl.
CPC ............ *G11C 13/00* (2013.01); *H01L 27/2409* (2013.01); *H01L 45/06* (2013.01); *H01L 45/16* (2013.01); *G11C 2213/71* (2013.01); *H01L 45/04* (2013.01); *H01L 27/224* (2013.01); *G11C 13/0023* (2013.01); *H01L 45/147* (2013.01); *G11C 7/00* (2013.01); *H01L 45/146* (2013.01); *G11C 13/0007* (2013.01); *G11C 13/0014* (2013.01); *G11C 2013/0073* (2013.01); *G11C 5/02* (2013.01); *G11C 13/0002* (2013.01); *G11C 13/0069* (2013.01); *G11C 13/0004* (2013.01)
USPC .............. 365/148; 365/52; 365/129; 365/163

(58) Field of Classification Search
USPC ........... 365/45, 81, 100, 148, 189.02, 189.18, 365/206
See application file for complete search history.

(56) References Cited

U.S. PATENT DOCUMENTS

| | | | | |
|---|---|---|---|---|
| 4,646,266 | A * | 2/1987 | Ovshinsky et al. | 365/105 |
| 6,034,882 | A * | 3/2000 | Johnson et al. | 365/103 |
| 6,385,074 | B1 | 5/2002 | Johnson et al. | 365/103 |
| 6,735,104 | B2 | 5/2004 | Scheuerlein | 365/51 |
| 6,906,361 | B2 | 6/2005 | Zhang | 257/211 |
| 7,112,815 | B2 | 9/2006 | Prall | 257/2 |
| 7,307,268 | B2 | 12/2007 | Scheuerlein | 257/2 |

(Continued)

OTHER PUBLICATIONS

Hudgens, S. and B. Johnson, "Overview of Phase-Change Chalcogenide Nonvolatile Memory Technology," Nov. 2004, MRS Bulletin, pp. 1-4.*

*Primary Examiner* — Son Dinh
*Assistant Examiner* — Uyen B Tran
(74) *Attorney, Agent, or Firm* — Ido Tuchman; Vazken Alexanian

(57) ABSTRACT

Memory device and method for fabricating a memory device on two layers of a semiconductor wafer. An example device includes bit lines and word lines fabricated at one layer of a semiconductor wafer and re-writable nonvolatile memory cells that include a two-terminal access device with a bidirectional voltage-current characteristics for positive and negative voltages applied at the terminals. Additionally, a drive circuit electrically coupled to the memory cells and configured to program the memory cells is fabricated at another layer of the semiconductor wafer. Another example embodiment includes a memory device where a plurality of memory arrays are fabricated at one layer of a semiconductor wafer and a plurality of drive circuits electrically coupled to the memory cells and configured to read the memory cells are fabricated at a second layer of the semiconductor wafer.

22 Claims, 9 Drawing Sheets

(56) References Cited

U.S. PATENT DOCUMENTS

| | | | |
|---|---|---|---|
| 7,382,647 B1 | 6/2008 | Gopalakrishnan | 365/163 |
| 7,459,717 B2 | 12/2008 | Lung | 257/4 |
| 7,573,736 B2 | 8/2009 | Wang et al. | 365/158 |
| 7,983,065 B2* | 7/2011 | Samachisa | 365/51 |
| 2003/0202404 A1* | 10/2003 | Scheuerlein | 365/200 |
| 2008/0304308 A1* | 12/2008 | Stipe | 365/51 |

* cited by examiner

3D ARCHITECTURE FOR BIPOLAR MEMORY USING BIPOLAR ACCESS DEVICE

BACKGROUND

This invention relates to memory in semiconductor devices. More particularly, the present invention relates to fabricating memory cells and drive circuits on different layers of a semiconductor wafer for bipolar memory devices.

Nonvolatile memory solutions are a growing focus for the next generation of memory devices. Where floating-gate transistors satisfy many current commercial needs, expansion and improvement in the industry may require the next generation of memory storage to work with unipolar and bipolar memory types. Resistive random-access memory (RRAM), phase change memory (PCM), magnetoresistive random-access memory (MRAM), and other memory types present new challenges in integrating memory elements into current memory devices. In particular, finding a memory design that allows for greater memory cell densities on a semiconductor chip may provide for greater memory array efficiency and reliability.

A central problem associated with present memory devices is that peripheral circuitry provides a large area overhead on the semiconductor wafer, which results in less space available for the memory cell array. For example, past solutions for implementing more efficient memory device involved utilizing multiple semiconductor wafers to fashion the memory device or stack unipolar memory cells on top of each other. These solutions, however, regularly experience problems with significant wiring overhead due to pitch mismatches.

BRIEF SUMMARY

Accordingly, one aspect of the present invention is a memory device. The memory device includes a first fabrication layer with a plurality of bit lines and a plurality of word lines. A plurality of re-writable nonvolatile memory cells electrically are coupled to the bit lines and the word lines. The memory cells and arranged in a plurality of predetermined rows and a plurality of predetermined columns. Furthermore, each memory cell includes a two-terminal bi-directional access device. A second fabrication layer is vertically aligned below the first fabrication layer. The second fabrication layer includes a first drive circuit electrically coupled to the memory cells. The drive circuit is configured to read the memory cells.

Another aspect of the present invention is a memory device with a plurality of memory arrays fabricated on a first fabrication layer. Each memory array includes a plurality of re-writable nonvolatile memory cells arranged in a plurality of predetermined rows and a plurality of predetermined columns. Each memory cell includes a two-terminal bi-directional access device. Each memory array also includes a second fabrication layer vertically aligned below the first fabrication layer and a first plurality of drive circuits disposed on the second fabrication layer. Each drive circuit is electrically coupled to a memory array in the first fabrication layer and is configured to read memory cells in the memory array.

Yet another aspect of the invention is a method of fabricating a memory device. The method includes receiving a semiconductor wafer with a first layer and a second layer. A fabricating step fabricates on the first layer a plurality of re-writable nonvolatile memory cells arranged in a plurality of predetermined rows and a plurality of predetermined columns. Each of the memory cells includes a two-terminal access device. Another fabricating step fabricates a drive circuit on the second layer electrically coupled to the memory cells. The drive circuit is configured to read the memory cells.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to various embodiments of the invention. Throughout the description of the invention, reference is made to FIGS. 1-8.

Figure 1:
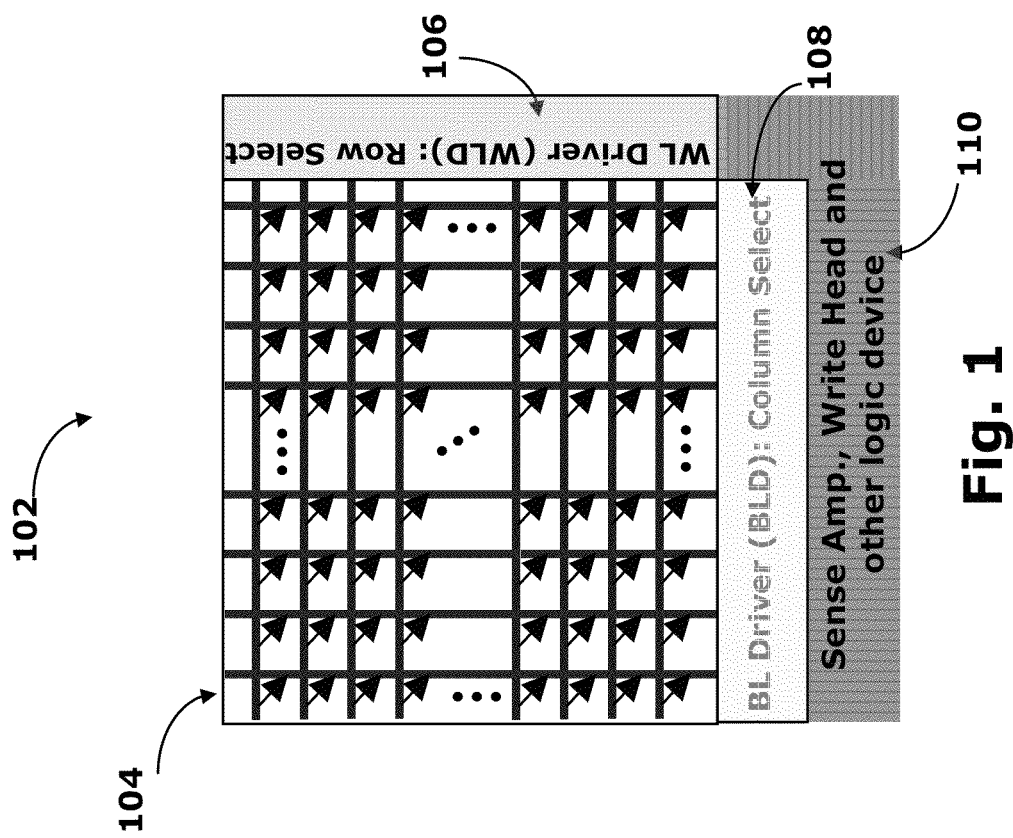
FIG. 1 shows a schematic drawing of a memory device in a planar conventional design, involving a memory cell array.

FIG. 1 shows a schematic drawing of a memory device 102 in a planar conventional design, where bit lines and word lines intersect to form individual memory cells. A cross-point memory cell array 104 is located on a semiconductor wafer. Peripheral circuitry, such as a bit line drive circuit 108, a word line drive circuit 106 and a sense amplifier and write head 110, are situated along the edge of the cross-point array 104.

Figure 2:
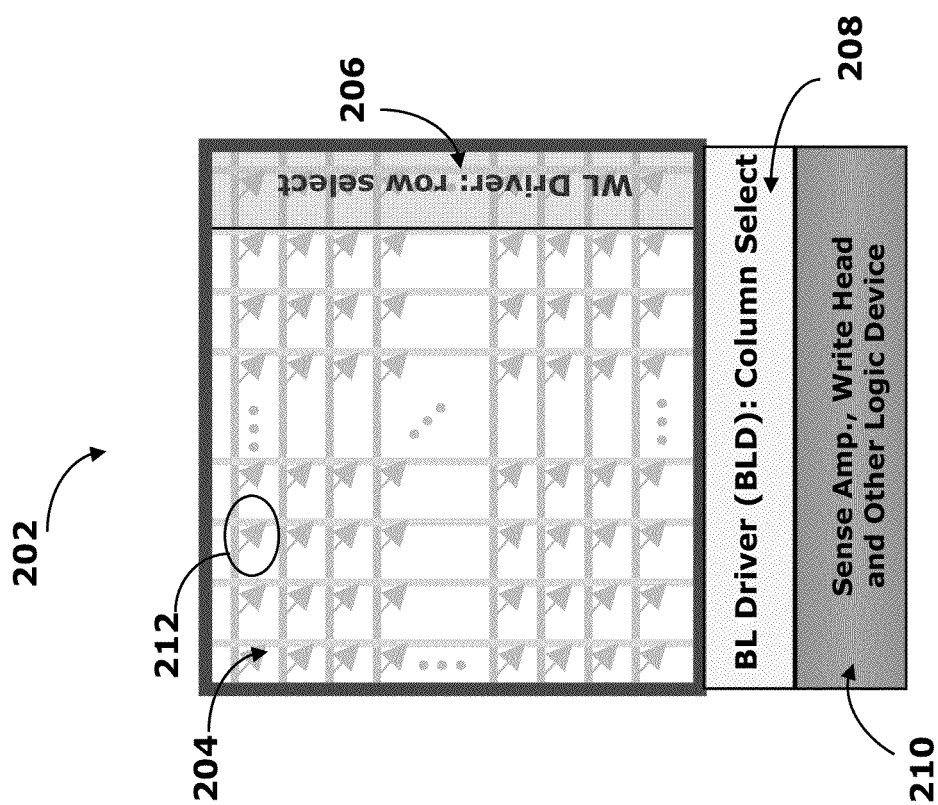
FIG. 2 shows a schematic drawing depicting a memory device with a word line drive circuit located underneath a cross-point memory cell array.

FIG. 2 shows a schematic drawing depicting an inventive embodiment of a memory device 202 on a single semiconductor wafer. In this embodiment, a word line drive circuit 206 is located underneath a cross-point memory cell array 204, while a bit line drive circuit 208, and the sense amplifier and write head 210 are disposed on the top of the fabrication layer along the edge of the cross-point array 204.

The cross-point memory array 204 includes a plurality of bit lines and a plurality of word lines and is fabricated at one layer of the semiconductor wafer. The word line drive circuit 206 is fabricated at a second layer vertically aligned underneath the first layer containing the cross-point array 204, while the word line drive circuit 206 is electrically coupled to the memory cells and configured to select or program a predetermined memory cell row corresponding to a word line signal. Additionally, the bit line drive circuit 208 is configured to select a predetermined memory cell column corresponding to a bit line signal. In this embodiment, the bit lines may also employ a higher level metal than the word line.

Word line drive circuits and the bit line drive circuits perform the same function of selecting and programming memory cells as they do in other inventive embodiments as described in FIGS. 3-8. On the cross-point array 204, individual re-writable nonvolatile memory cells 212 are arranged in a plurality of predetermined rows and a plurality of predetermined columns. Furthermore, each memory cell may include a two-terminal access device, also called a bipolar access device, which has a bidirectional current voltage characteristic for positive and negative voltages applied at its terminals. The two-terminal access device may correspond to a memory element as described in U.S. Pat. No. 7,382,647 titled "Rectifying Element for a Crosspoint Based Memory Array Device" and filed Feb. 27, 2007, incorporated herein by reference in its entirety, but other bidirectional devices are contemplated as well. The bit line driver 208 and the word line driver 206 may need to be biased properly in order to keep reverse leakage under control in the two-terminal access device.

Each memory cell may include Phase Change Memory (PCM), ferroelectric random access memory (FeRAM), or resistive random-access memory types, such as organic resistive memory, perovskite memory, and oxide resistive memory. Other memory types used by the memory cells are contemplated as well. Memory cells may also include memory elements specific to a bipolar memory configuration, such as magnetoresistive random access memory (MRAM), in particular Spin Torque Transfer Random Access Memory (STT RAM), but all types of MRAM, as well as other bipolar specific memories, are contemplated.

When this inventive embodiment utilizes bipolar memory, each memory cell is programmed to a first memory state by applying a first drive signal to the memory cell through the two-terminal access device in a first direction, and each memory cell is programmed to a second memory state by applying a second drive signal to the memory cell through the two-terminal access device in a second direction opposite the first direction. In STT RAM for example, memory is programmed to a '1' value by sending current in one direction, but the current must be reworked to send current in the opposite direction to write a '0' value. The two-terminal device may accomplish this task, and may even act as a switch, preventing current from passing through the two-terminals until a high enough voltage turns ON the two-terminal device. The memory cells and the two-terminal access device may be built between metal layers in the back-end-of-line (BEOL) fabrication process.

Figure 3A:
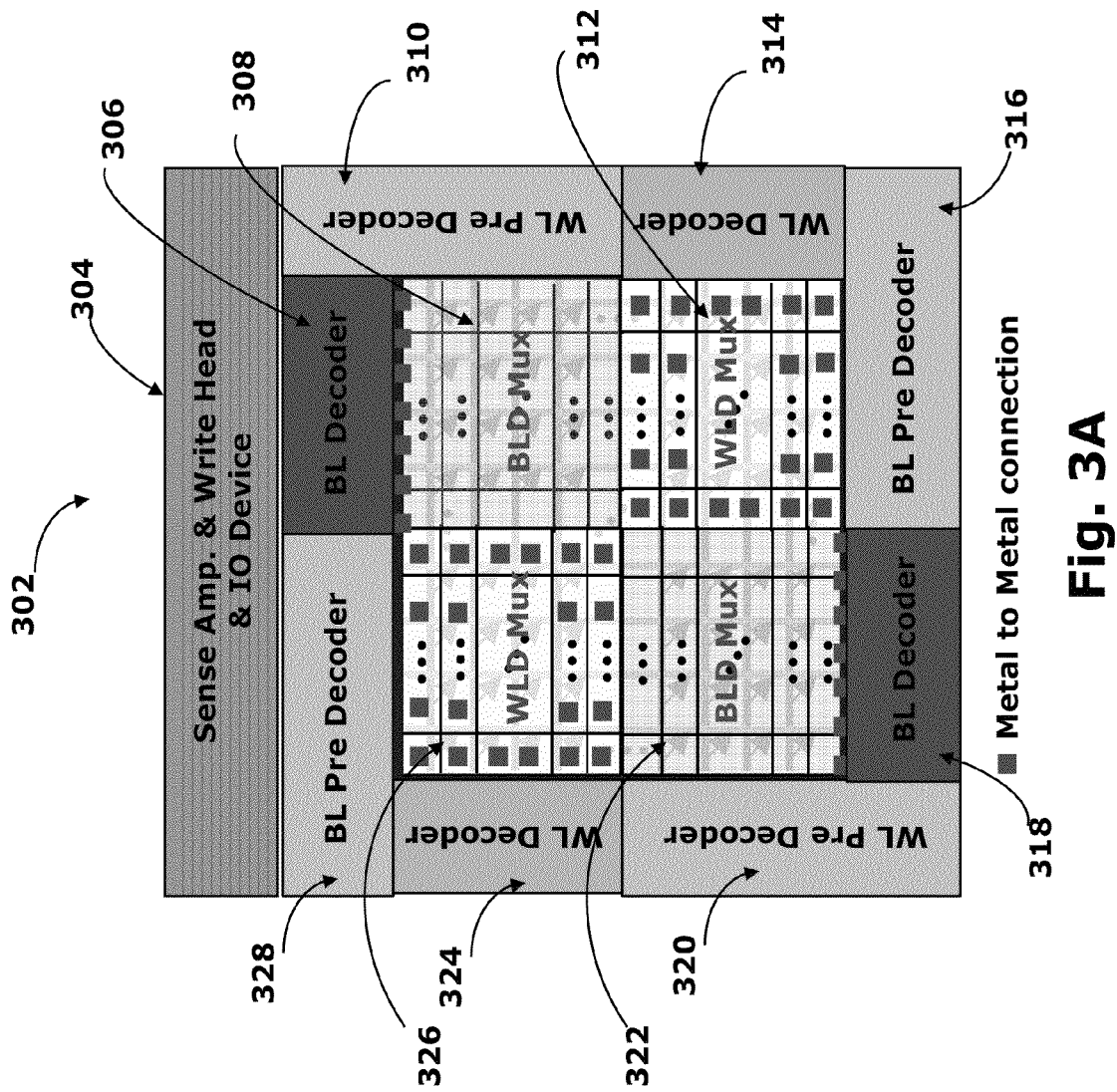
FIG. 3A shows a schematic drawing of a memory device where a word line drive circuit and a bit line drive circuit are disposed in a second fabrication layer vertically aligned underneath a cross-point memory cell array.

FIG. 3A shows a schematic drawing of a memory device 302, where a word line drive circuit and a bit line drive circuit are disposed in a second fabrication layer vertically aligned underneath a cross-point memory cell array, and exclusively disposed in quadrants that form a two by two matrix arrangement segmenting the cross-point memory array. In the four quadrants, the word line driver is exclusively disposed underneath a top-left quadrant 326 and bottom-right quadrant 312, while the bit line driver circuit is positioned underneath a bottom-left quadrant 322 and a top-right quadrant 308.

The word line drive circuit is electrically coupled to the memory cells and configured to select or program a predetermined memory cell row corresponding to a word line signal. Additionally, the bit line drive circuit is configured to select a predetermined memory cell column corresponding to a bit line signal.

In this inventive embodiment, peripheral circuitry, such as a bit line predecoder 316, a bit line decoder 306, a word line predecoder 310, a word line decoder 314, and a peripheral component 304 including a sense amplifier, a write head, and an input/output device are disposed along the edge of the cross-point memory array. As seen in FIG. 3A, the word line driver in the top-left quadrant 326 and the bottom-right quadrant 312 are electrically coupled to memory cells through metal to metal vias with the array area. The bit line driver in the bottom-left quadrant 322 and the top-right quadrant 308 may be connected to memory cells through metal to metal vias along the edge.

Figure 3B:
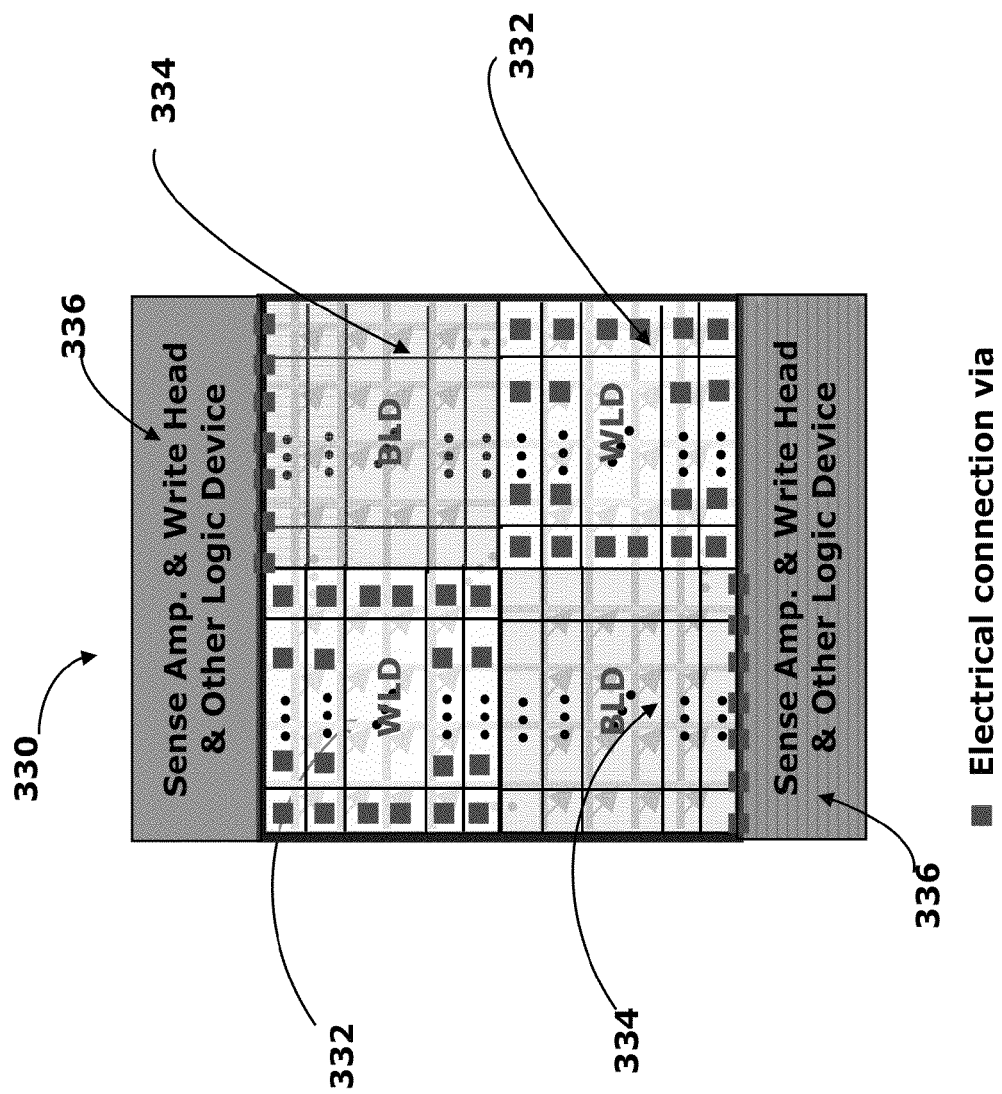
FIG. 3B shows another schematic drawing of a memory device where a word line drive circuit and a bit line drive circuit are disposed in a second fabrication layer vertically aligned underneath a cross-point memory cell array.

FIG. 3B shows another schematic drawing of a memory device 330, where a word line drive circuit 332 and a bit line drive circuit 334 are disposed in a second fabrication layer vertically aligned underneath a cross-point memory cell array, and exclusively disposed in quadrants that form a two by two matrix arrangement segmenting the cross-point memory array. In this embodiment, peripheral circuitry 336, such as sense amps, write heads and other logic devices are disposed along the edge(s) of the cross-point memory array.

Figure 4:
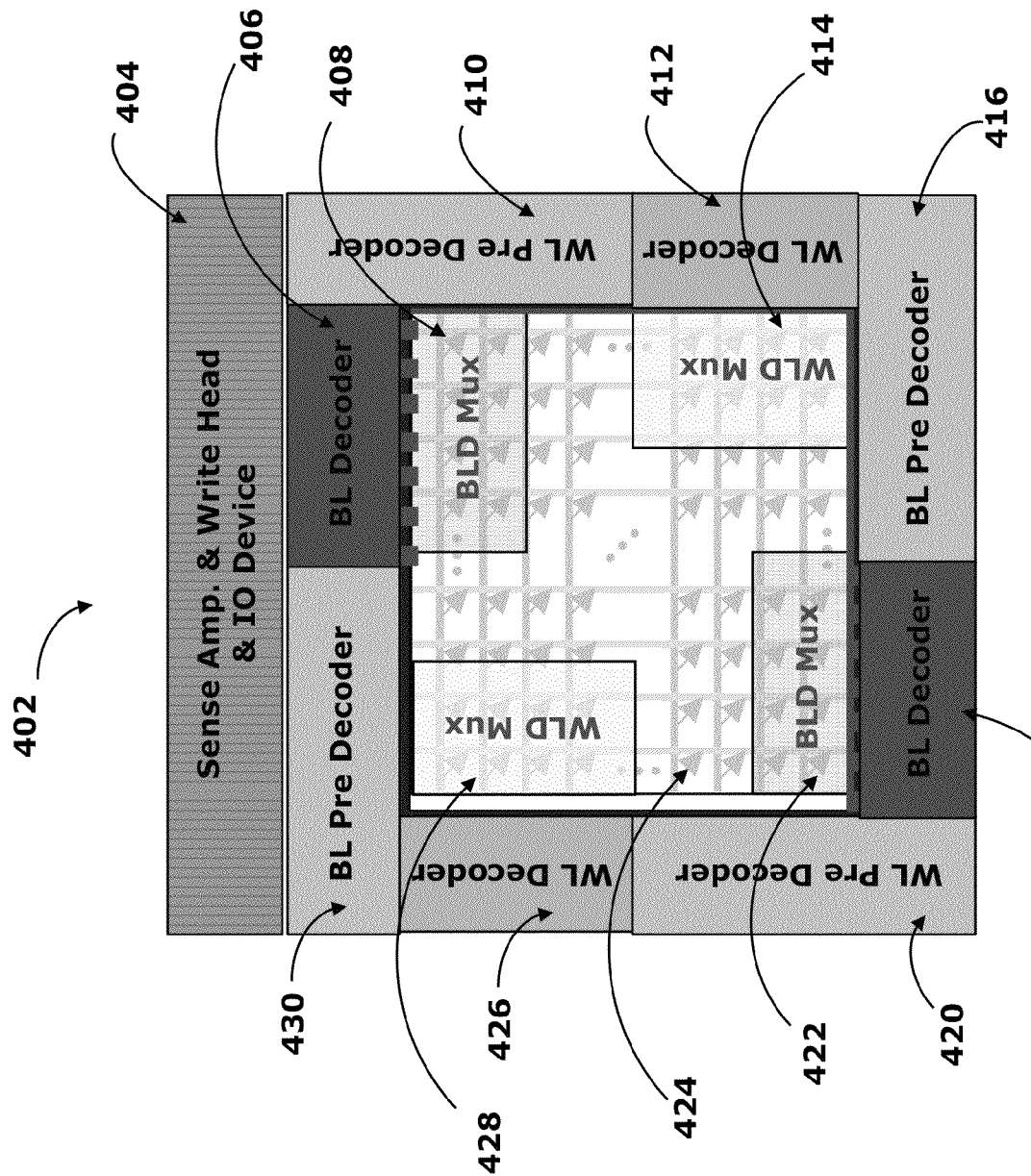
FIG. 4 shows a schematic drawing of a memory device with a word line drive circuit and a bit line drive circuit disposed in a second fabrication layer vertically aligned underneath a cross-point memory array.

FIG. 4 shows a schematic drawing of a memory device 402, where a word line drive circuit and a bit line drive circuit are disposed in a second fabrication layer vertically aligned underneath a cross-point memory array 424. The bit line drive circuit includes a first bit line multiplexer 408 and a second bit line multiplexer 422, while the word line circuit includes a first word line multiplexer 414 and a second word line multiplexer 428. In this inventive embodiment, peripheral circuitry, such as a bit line predecoder 416, a bit line decoder 406, a word line predecoder 410, a word line decoder 412, and a peripheral component 404 including a sense amplifier, a write head and an input/output device are disposed along the edge of the cross-point memory array 424.

Figure 5:
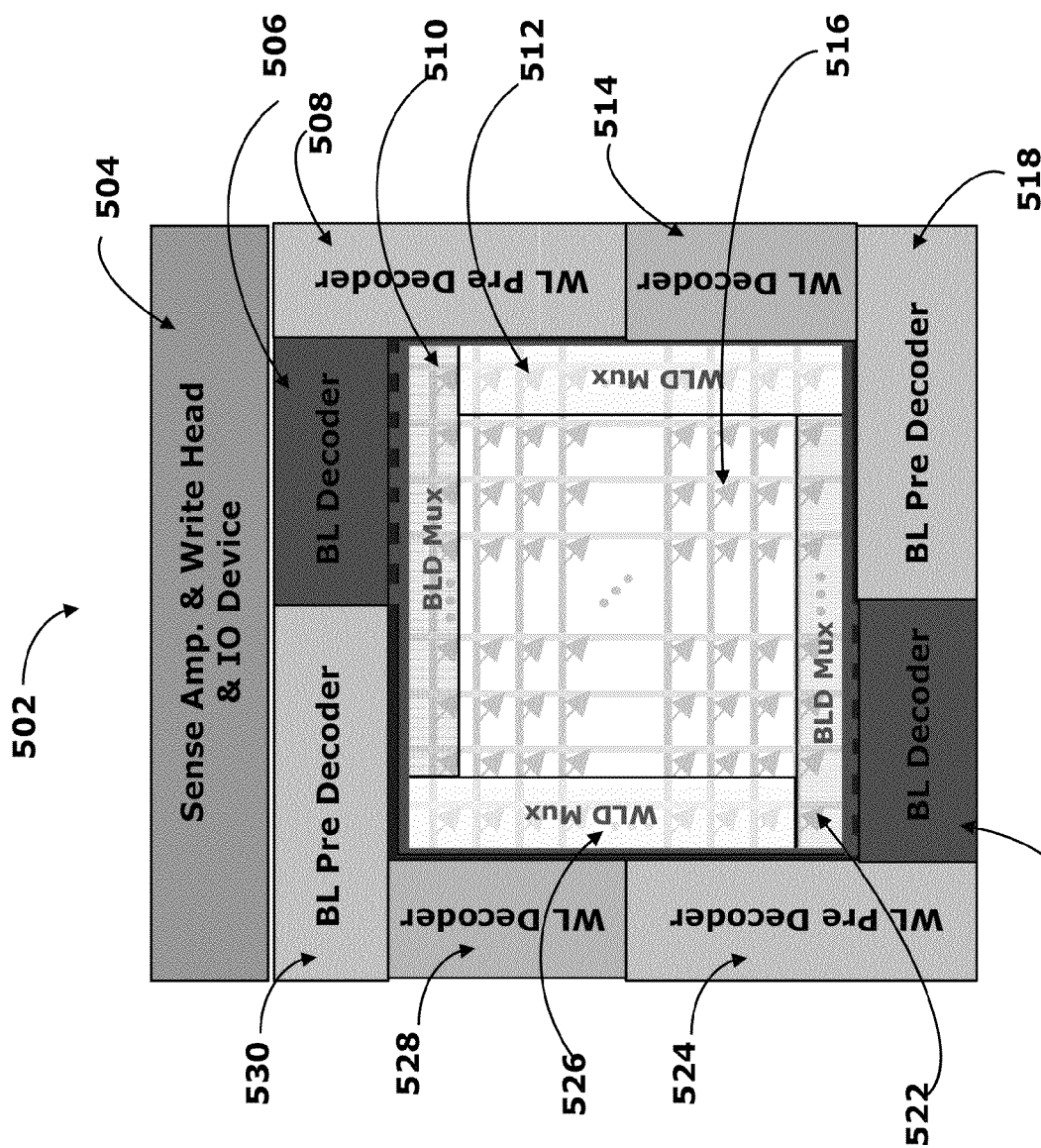
FIG. 5 is a schematic drawing depicting a memory device involving a memory cell array and utilizing principles from the present invention.

FIG. 5 shows a schematic drawing of a memory device 502, where a word line drive circuit and a bit line drive circuit are disposed in a second fabrication layer vertically aligned underneath a cross-point memory cell array 516. The bit line drive circuit includes a first bit line multiplexer 510 and a second bit line multiplexer 522, while the word line circuit includes a first word line multiplexer 512 and a second word line multiplexer 526. In this inventive embodiment, peripheral circuitry, such as a bit line predecoder 518, a bit line decoder 506, a word line predecoder 508, a word line decoder 514, and a peripheral component 504 including a sense amplifier, a write head, and an input/output. Device are disposed along the edge of the cross-point memory cell array 424. In contrast to FIG. 4, FIG. 5 increases the pitch, or the center-to-center distance of semiconductor components, of the bit line multiplexers 510 and 522, as well as the word line multiplexers 512 and 526.

Figure 6:
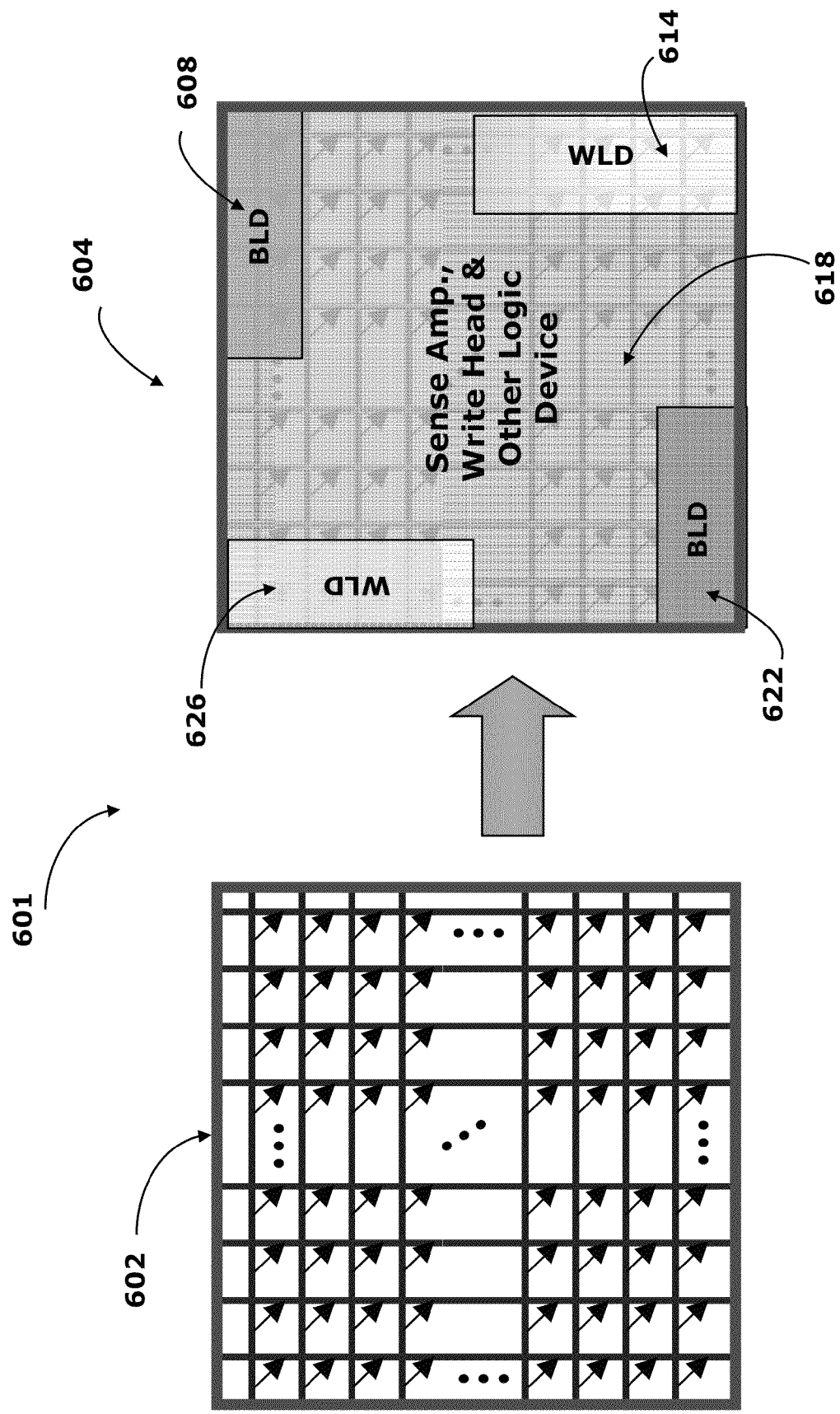
FIG. 6 shows a memory device including a back-end-of-line fabricated cross-point memory cell array and a corresponding layer including all buried peripheral circuitry.

FIG. 6 shows a memory device 601 including a back-end-of-line fabricated cross-point memory cell array 602 and a corresponding layer 604 including all buried peripheral circuitry. In this inventive embodiment, bit line drivers 608 and 622, word line drivers 614 and 626, and other circuitry 618, such as bit line decoders, word line decoders, word line predecoders, bit line predecoders, a sense amplifier and write head, are buried completely below the cross-point memory array 602.

Figure 7:
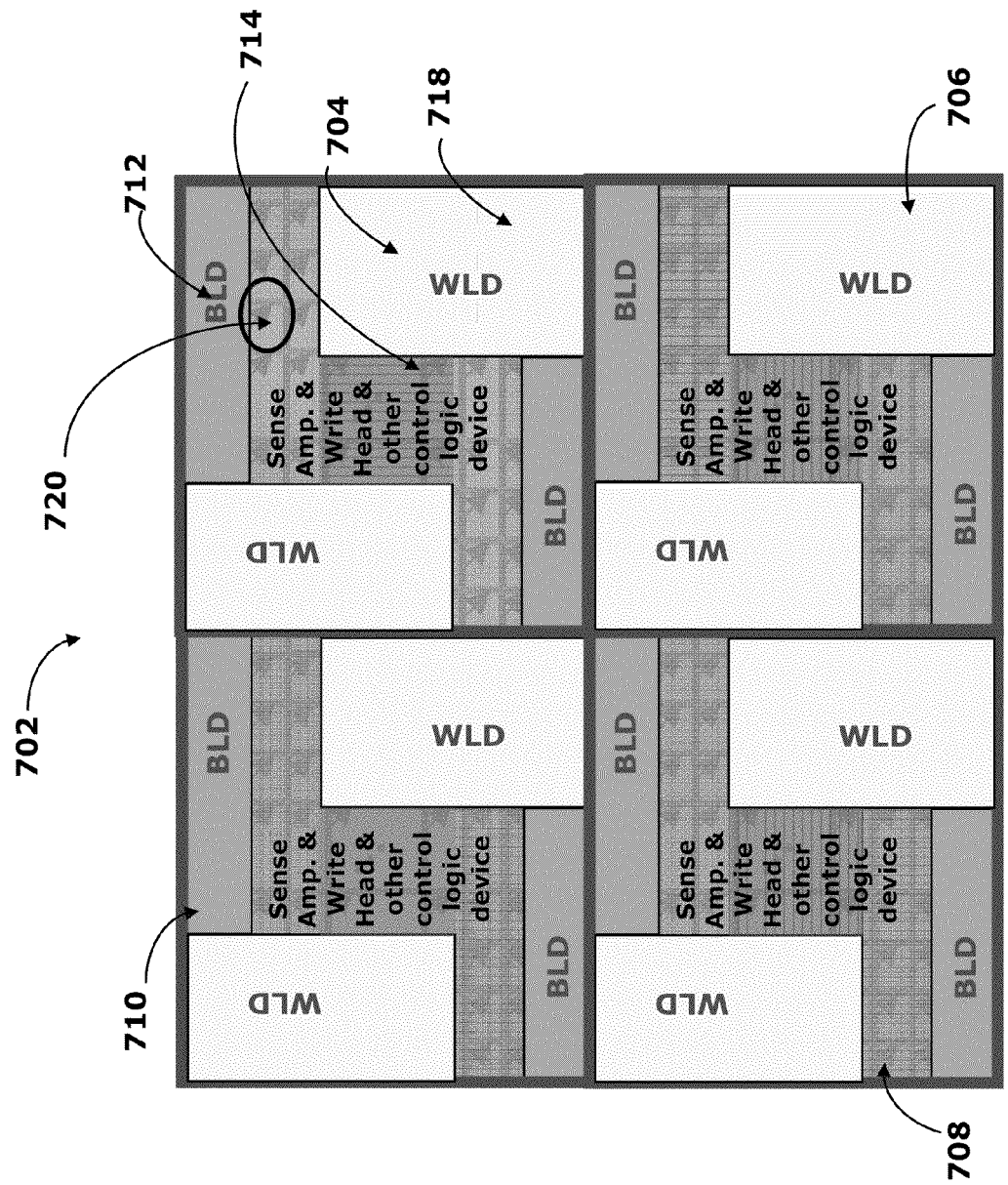
FIG. 7 shows a schematic drawing of a memory device including a super-array of multiple distinct memory arrays disposed on a single semiconductor wafer, which utilizes principles from the present invention.

FIG. 7 shows a schematic drawing of a memory device 702 including a super-array of multiple distinct memory arrays disposed on a single semiconductor wafer. In this inventive embodiment, a top-left memory array 710, a top-right memory array 704, a bottom-left memory array 708, and a bottom-right array 706 are all fabricated on a single semiconductor wafer. The memory arrays include bit line drivers 712, word line drivers 718, and peripheral circuitry 714, such as a word line decoder, a bit line decoder, a sense amplifier and write head, etc. fabricated on a first layer. An input/output device may also be included on the first layer. A cross point memory array 720 is located on a second layer that is vertically aligned with the first layer.

The cross-point memory cell array 714 may include a plurality of re-writable nonvolatile memory cells arranged in a plurality of predetermined rows and a plurality of predetermined columns. The individual memory cells 720 may include a two-terminal access device the two-terminal access device having a bidirectional current-voltage characteristic for positive and negative voltages applied at its terminals. While the memory array 704 may be an example of other memory arrays on the semiconductor wafer, other embodiments are contemplated where different memory array layouts are contained on the same wafer. The memory super-array 702 may include a first and second plurality of drive circuits, each of the drive circuits from the first plurality and the second plurality being electrically are coupled to a memory array and configured to read memory cells. Each of the drive circuits from the second plurality may be configured to select a predetermined memory cell row corresponding to a word line signal, while each drive circuit in the first plurality of drive circuits may be configured to select a predetermined memory cell column corresponding to a bit line signal.

While four distinct memory arrays are present in this embodiment, a plurality of memory arrays encompassing odd or even numbers, as well as memory arrays of different sizes with different memory components fabricated on the same semiconductor layer, are contemplated. The memory elements of each memory array may include Phase Change Memory (PCM), ferroelectric random access memory (FeRAM), and resistive random-access memory types, such as organic resistive memory, perovskite memory, and oxide resistive memory, but other memory types are contemplated as well. The memory cell may also include bipolar memory elements such as magnetoresistive random access memory (MRAM), in particular Spin Torque Transfer Random Access Memory (STT RAM), but all types of MRAM are contemplated. For bipolar memory, the memory cells in a memory array are programmed to a first memory state by applying a first drive signal to the memory cell through the two-terminal access device in a first direction; the memory cells in a memory array are programmed to a second memory state by applying a second drive signal to the memory cell through the two-terminal access device in a second direction opposite the direction of the first drive signal. The drive circuit may be electrically coupled to memory cells by a metal to metal VIA.

While not the case in FIG. 7, in another embodiment, each memory array may disposed as to have the word line drive circuit and a bit line drive circuit in a second fabrication layer, separate from a cross-point memory array, and exclusively disposed in quadrants that form a two by two matrix arrangement segmenting the cross-point memory array. The word line drive circuit is electrically coupled to the memory cells and configured to select a predetermined memory cell row corresponding to a wordline signal. The bit line drive circuit may be configured to select a predetermined memory cell column corresponding to a bit line signal. In the four quadrants, the word line driver is exclusively disposed underneath a top-left quadrant and bottom-right quadrant, and the bit line driver circuit is positioned underneath a bottom-left quadrant and a top-right quadrant.

Figure 8:
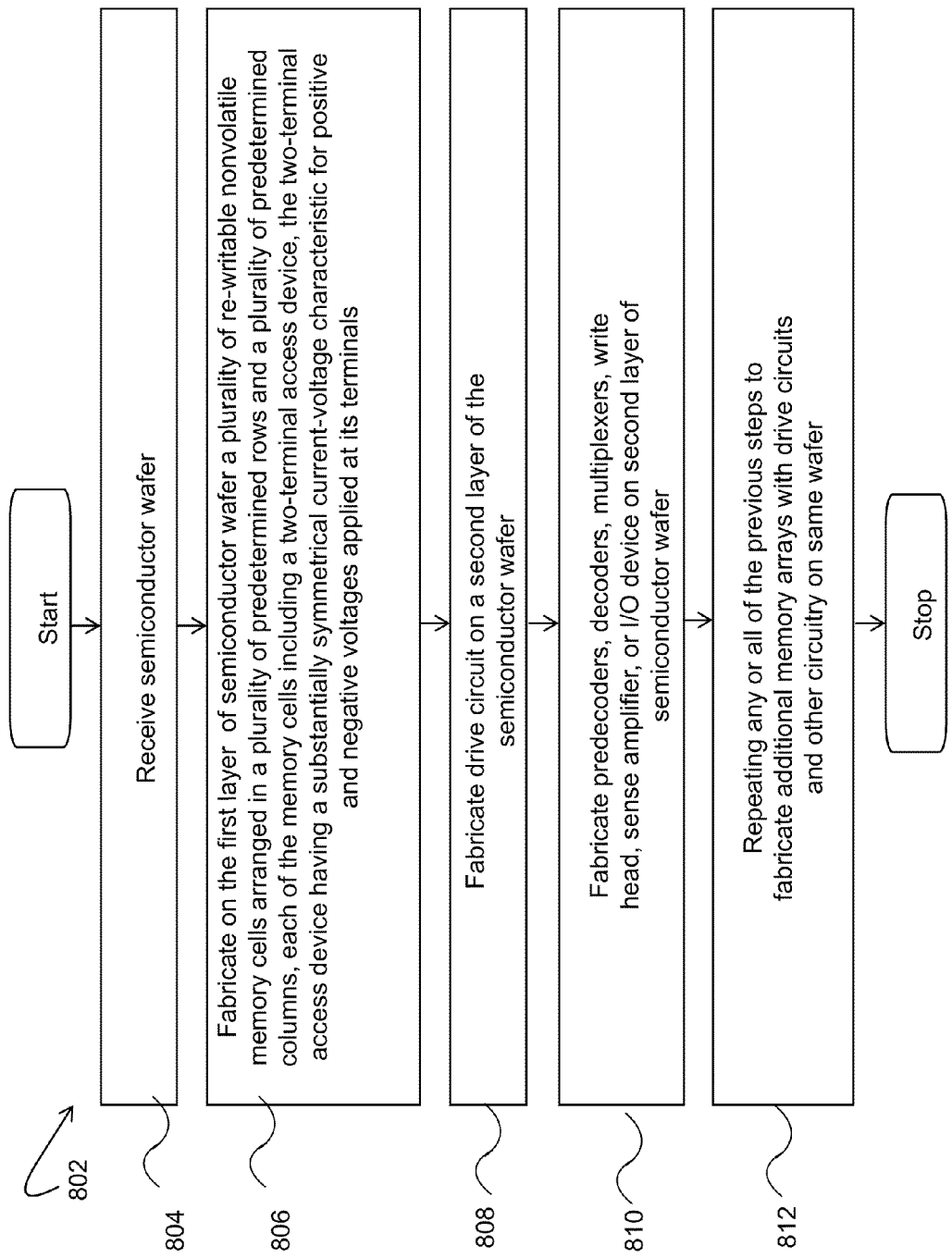
FIG. 8 is a flowchart depicting a fabrication process where a plurality of memory arrays and additional components are fabricated on a multilayer semiconductor device in accordance with one embodiment of the present invention.

FIG. 8 is a flowchart for an example method 802 for fabricating a memory device that utilizes principles of the present invention. This method 802 may include the steps of: providing a semiconductor wafer 804, fabricating an array of memory cells on a first layer of the wafer 806, fabricating a drive circuit on a second layer of the semiconductor wafer 808, fabricating decoders, multiplexers, write heads, sense amplifiers or an I/O Device on a layer of the semiconductor wafer 810, and repeating any or all of the previous steps to fabricate additional memory arrays with drive circuits and other circuitry on the same semiconductor wafer. The order of steps for the method 802 are not exclusive and may be performed in the enumerated order or another order, and may exempt certain steps from the process altogether.

In operation 806 of the embodiment, a cross-point memory cell array may be fabricated to include a plurality of predetermined rows and a plurality of predetermined columns, and where each memory cell may include a two-terminal access device, which may also be called a bipolar access device, which has a bidirectional current voltage characteristic for positive and negative voltages applied at its terminals.

Memory cells used in operation 806 may include Phase Change Memory (PCM), ferroelectric random access memory (FeRAM), and resistive random-access memory elements, such as organic resistive memory, perovskite memory, and oxide resistive memory, but other memory types are contemplated as well. The memory cell may also include bipolar memory elements such as magnetoresistive random access memory (MRAM), in particular Spin Torque Transfer Random Access Memory (STT RAM), but all types of MRAM or bipolar memory are contemplated.

For an embodiment of the method 802 that utilizes bipolar memory cells, the memory cells are programmed to a first memory state by applying a first drive signal to the memory cell through the two-terminal access device in a first direction, and the memory cells are programmed to a second memory state by applying a second drive signal to the memory cell through the two-terminal access device in a second direction opposite the direction of the first drive signal. The cross-point memory array may also be disposed such that the layer containing the memory array and the layer containing the first drive circuit are each configured in corresponding two by two matrix arrangements, where the second drive circuit is exclusively disposed in a top-left quadrant and a bottom-right quadrant, and the first drive circuit is exclusively disposed in a bottom-left quadrant and a top-right quadrant. One example of such an embodiment would involve a word line driver being exclusively disposed underneath a top-left quadrant and bottom-right quadrant, and the bit line driver circuit is positioned underneath a bottom-left quadrant and a top-right quadrant.

In keeping with FIG. 8, operation 808 involves fabricating to a second layer of the semiconductor wafer a drive circuit, which is electrically coupled to the memory cells and configured to read the memory cells. The drive circuit may be a word line or bit line drive circuit, and may be electrically coupled to the memory cells through metal to metal VIAS. A second drive circuit as well may be fabricated at the second layer of the wafer. In an embodiment where both the word line drive circuit and the bit line drive circuit are fabricated at the second layer, the bit line drive circuit is configured to select a predetermined memory cell row corresponding to a bit line signal, and the word line drive circuit is configured to selected a predetermined memory cell column corresponding to a word line signal.

In operation 810, peripheral circuitry, such as a bit line predecoder, a bit line decoder, a word line predecoder, a word line decoder, and a peripheral component including a Sense Amplifier, a Write Head, and an Input/Output Device may be fabricated on a second fabrication layer separate from the layer containing the cross-point memory array.

In operation 812, steps involved in the method 802 may be repeated in order to fabricate multiple memory arrays to a single wafer. Repeated steps need not be repeated after all previous steps are performed, but may be repeated simultaneously, before, or after any of the operations 804 through 810. For example, multiple operation 806s may be performed in conjunction with each other, where a wafer containing two memory arrays may be needed.

Flowcharts in the Figures illustrate the architecture, functionality, and operation of possible implementations of systems and methods according to various embodiments of the present invention. In this regard, each block in the flowchart may represent a step or operation which comprises one or more steps or operations for implementing the block. It should also be noted that, in some alternative implementations, the steps noted in the block may occur out of the order noted in the Figures. For example, two blocks shown in succession may, in fact, be performed substantially concurrently, or the blocks may sometimes be executed in the reverse order, depending upon the functionality involved.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A memory device comprising:
   a first fabrication layer including a plurality of bit lines and a plurality of word lines;
   a plurality of re-writable nonvolatile memory cells electrically coupled to the bit lines and the word lines, the memory cells are arranged in a plurality of predetermined rows and a plurality of predetermined columns, each memory cell including a two-terminal bi-directional access device, the two-terminal bi-directional access device comprising a solid electrolyte material configured as a rectifier;
   a second fabrication layer vertically aligned below the first fabrication layer, the second fabrication layer including a first drive circuit electrically coupled to the memory cells, the drive circuit configured to read the memory cells;
   wherein each of the memory cells is programmed to a first memory state by applying a first drive signal to the memory cell through the two-terminal access device in a first direction;
   wherein each of the memory cells is programmed to a second memory state by applying a second drive signal to the memory cell through the two-terminal access device in a second direction opposite the first direction.

2. A memory device, as recited in claim 1, further comprising:
   a second drive circuit disposed in the second fabrication layer, the second drive circuit electrically coupled to the memory cells and configured to select a predetermined memory cell row corresponding to a word line (WL) signal; and
   wherein the first drive circuit is configured to select a predetermined memory cell column corresponding to a bit line (BL) signal.

3. A memory device, as recited in claim 2, wherein the first fabrication layer and the second fabrication layer are each configured in a two by two matrix arrangement, the second drive circuit is exclusively disposed in a top-left quadrant and a bottom-right quadrant, and the first drive circuit is exclusively disposed in a bottom-left quadrant and a top-right quadrant.

4. A memory device, as recited in claim 1, wherein the drive circuit is electrically coupled to the memory cells by electrically conducting vias.

5. A memory device, as recited in claim 1, wherein the memory cells are Spin Torque Transfer Random Access Memory (STT RAM).

6. A memory device, as recited in claim 1, wherein the memory cells are Resistive Random Access Memory (RRAM).

7. A memory device, as recited in claim 1, wherein the memory cells comprise at least one of: Phase Change Memory (PCM), magnetoresistive random access memory (MRAM), ferroelectric random access memory (FeRAM), organic resistive memory and perovskite memory.

8. A memory device, as recited in claim 1, wherein the second fabrication layer includes at least one of: a decoder circuit, a multiplexer (MUX) circuit, a sense amplifier, and a write head and input/output (I/O) circuit.

9. A memory device comprising:
   a first fabrication layer including a plurality of memory arrays, each memory array comprising:
   a plurality of re-writable nonvolatile memory cells arranged in a plurality of predetermined rows and a plurality of predetermined columns, each memory cell including a two-terminal bi-directional access device, the two-terminal bi-directional access device comprising a solid electrolyte material configured as a rectifier;
   a second fabrication layer vertically aligned below the first fabrication layer; and
   a first plurality of drive circuits disposed on the second fabrication layer, wherein each drive circuit is electrically coupled to the memory array in the first fabrication layer, each drive circuit configured to read memory cells in the memory array;
   wherein each of the memory cells in the memory array are programmed to a first memory state by applying a first drive signal to the memory cell through the access device in a first direction;
   wherein each of the memory cells in the memory array are programmed to a second memory state by applying a second drive signal to the memory cell through the access device in a second direction opposite the direction of the first drive signal.

10. A memory device, as recited in claim 9, further comprising:
    a second plurality of drive circuits, each of the drive circuits from the second plurality being electrically coupled to the memory array, each of the drive circuits from the second plurality configured to select a predetermined memory cell row corresponding to a word line (WL) signal; and
    wherein each drive circuit in the first plurality of drive circuits is configured to select a predetermined memory cell column corresponding to a bit line (BL) signal.

11. A memory device, as recited in claim 9, wherein a drive circuit is electrically coupled to at least one of the memory cells in the memory array by electrically conducting vias.

12. A memory device, as recited in claim 9, further comprising:
   wherein each memory array is configured in a two by two matrix arrangement;
   a first drive circuit is electrically coupled to memory cells in a top-left quadrant and a bottom-right quadrant, the first drive circuit exclusively disposed in the second fabrication layer below the top-left and the bottom-right quadrant, and the first drive circuit configured to program memory cells; and
   a second drive circuit is electrically coupled to memory cells in a bottom-left quadrant and a top-right quadrant, the second drive circuit exclusively disposed in the second fabrication layer below the bottom-left and the top-right quadrant, and the second drive circuit configured to program memory cells.

13. A memory device, as recited in claim 9, wherein the memory cells are Spin Torque Transfer Random Access Memory (STT RAM).

14. A memory device, as recited in claim 9, wherein the memory cells comprise at least one of: Phase Change Memory (PCM), magnetoresistive random access memory (MRAM), ferroelectric random access memory (FeRAM), organic resistive memory and perovskite memory.

15. A memory device, as recited in claim 9, wherein the second fabrication layer includes at least one of: a decoder circuit, a multiplexer (MUX) circuit, a sense amplifier, and a write head and input/output (I/O) circuit.

16. A method of fabricating a memory device, the method comprising:
   receiving a semiconductor wafer including a first layer and a second layer;
   fabricating on the first layer a plurality of re-writable non-volatile memory cells arranged in a plurality of predetermined rows and a plurality of predetermined columns, each of the memory cells including a two-terminal access device, the two-terminal bi-directional access device comprising a solid electrolyte material configured as a rectifier; and
   fabricating a drive circuit on the second layer electrically coupled to the memory cells, the drive circuit configured to read the memory cells;
   wherein the memory cells are programmed to a first memory state by applying a first drive signal to the memory cell through the access device in a first direction, the memory cells are programmed to a second memory state by applying a second drive signal to the memory cell through the access device in a second direction opposite the direction of the first drive signal.

17. The method of fabricating a memory device as recited in claim 16, wherein the drive circuit is configured to select a predetermined memory cell row corresponding to a bit line (BL) signal, and
   the memory array comprises a second drive circuit disposed in the second fabrication layer, the drive circuit electrically coupled to the memory cells and configured to select a predetermined memory cell column corresponding to a word line (WL) signal.

18. The method of fabricating a memory device as recited in claim 17, further comprising:
   wherein the first layer and the second layer are each configured in corresponding two by two matrix arrangements,
   wherein the second drive circuit is exclusively disposed in a top-left quadrant and a bottom-right quadrant, and
   wherein the first drive circuit is exclusively disposed in a bottom-left quadrant and a top-right quadrant.

19. The method of fabricating a memory device as recited in claim 16, wherein the drive circuit is electrically coupled to the memory cells by electrically conducting vias.

20. The method of fabricating a memory device as recited in claim 16, wherein the memory cells are Spin Torque Transfer Random Access Memory (STT RAM).

21. The method of fabricating a memory device as recited in claim 16, wherein the memory cells comprise at least one of: Phase Change Memory (PCM), magnetoresistive random access memory (MRAM), ferroelectric random access memory (FeRAM), organic resistive memory and perovskite memory.

22. The method of fabricating a memory device as recited in claim 16, wherein the second fabrication layer includes at least one of: a decoder circuit, a multiplexer (MUX) circuit, a sense amplifier, and a write head and input/output (I/O) circuit.

* * * * *